United States Patent
Lim (10) Patent No.: US 8,870,047 B2
(45) Date of Patent: Oct. 28, 2014

(54) WAFER DICING PRESS AND METHOD AND SEMICONDUCTOR WAFER DICING SYSTEM INCLUDING THE SAME

(75) Inventor: Won-chul Lim, Asan-si (KR)

(73) Assignee: Samsung Electronics Co., Ltd. (KR)

(*) Notice: Subject to any disclaimer, the term of this patent is extended or adjusted under 35 U.S.C. 154(b) by 258 days.

(21) Appl. No.: 13/336,218

(22) Filed: Dec. 23, 2011

(65) Prior Publication Data

US 2012/0196426 A1 Aug. 2, 2012

(30) Foreign Application Priority Data

Feb. 1, 2011 (KR) .................. 10-2011-0010308

(51) Int. Cl.
- *H01L 21/78* (2006.01)
- *B65H 35/10* (2006.01)
- *B30B 1/00* (2006.01)
- *B28D 5/00* (2006.01)

(52) U.S. Cl.
CPC .............. *B28D 5/0011* (2013.01); *H01L 21/78* (2013.01)
USPC ... 225/96; 100/214; 219/121.6; 257/E21.599; 451/66; 451/69

(58) Field of Classification Search
CPC ......... H01L 21/78; H01L 21/00; H01L 21/67; H01L 21/673; H01L 21/6835; H01L 21/6836; H01L 2221/68327; H01L 27/14687
USPC .......... 100/214; 219/121.6; 225/96; 257/E21.599; 451/66, 69
See application file for complete search history.

(56) References Cited

U.S. PATENT DOCUMENTS

| 3,970,819 | A | * | 7/1976 | Gates et al. .............. 219/121.69 |
| 4,296,542 | A | * | 10/1981 | Gotman ......................... 438/17 |
| 5,785,225 | A | * | 7/1998 | Loomis ........................ 225/96.5 |
| 2005/0282359 | A1 | * | 12/2005 | Nagai et al. .................. 438/459 |
| 2007/0111476 | A1 | * | 5/2007 | Sugiura et al. ................ 438/460 |
| 2010/0035408 | A1 | * | 2/2010 | Hoshino et al. ............... 438/463 |

FOREIGN PATENT DOCUMENTS

| JP | 2007142002 | 6/2007 |
| JP | 4409840 | 2/2010 |
| KR | 1020100070159 | 6/2010 |

* cited by examiner

*Primary Examiner* — Peniel M Gumedzoe
(74) *Attorney, Agent, or Firm* — Onello & Mello, LLP (57) ABSTRACT

In a wafer dicing press for reducing time and cost for wafer dicing and for evenly applying a dicing pressure to a whole wafer, a wafer dicing press includes a support unit supporting a first side of a wafer; and a pressurization device applying a pressure, by dispersing the pressure, to a second side of the wafer so that a laser-scribed layer of the wafer operates as a division starting point. Accordingly, the wafer dicing press reduces laser radiation and pressure-application times for dividing a wafer into semiconductor devices. This increased efficiency is achieved without increasing the likelihood of damaging the wafer.

15 Claims, 5 Drawing Sheets

WAFER DICING PRESS AND METHOD AND SEMICONDUCTOR WAFER DICING SYSTEM INCLUDING THE SAME

CROSS-REFERENCE TO RELATED APPLICATIONS

This application claims the benefit of Korean Patent Application No. 10-2011-0010308, filed on Feb. 1, 2011, in the Korean Intellectual Property Office, the disclosure of which is incorporated herein in its entirety by reference.

BACKGROUND

The inventive concept relates to a wafer dicing press and method and a semiconductor wafer dicing system including the same. More particularly, the inventive concept relates to a wafer dicing press and method for reducing the time and cost associated with wafer dicing. Additionally, the inventive concept relates to ensuring that all devices within a wafer are successfully separated from one another without damaging the devices.

In the semiconductor manufacturing process, a plurality of semiconductor device regions are typically formed on a single wafer, with the device regions separated by inactive areas referred to as "scribe lanes." Individual devices are formed by separating the device regions along the scribe lanes. Although an individual scribe lane occupies a relatively small area, cumulatively, over an entire wafer, scribe lanes can significantly reduce the wafer area available for the formation of active devices. In order to maximize wafer yield, manufacturers have sought to reduce the area dedicated to scribe lanes. Conventionally, wafers were diced using saws having diamond or carbide tips that scribed frangible lines within the scribe lanes. Once the frangible lines were formed, the wafer was split along the frangible lines, thereby forming individual devices. As scribe lanes have been narrowed in order to allow for more devices to be formed on a wafer, the process margin for dicing has been reduced. More recently, the use of laser scribing has been introduced in order to further diminish the width of scribe lanes (and, concomitantly, increase wafers' yields). However, the very fine tolerances, thin wafers, and narrow scribe lanes of today's wafers make it difficult to separate devices (that is, to "dice" devices) without damaging them, leaving some devices joined, or introducing unwanted contaminants.

SUMMARY

The inventive concept provides a wafer dicing press for improving productivity by reducing laser beam radiation time and dicing press time and for preventing failures arising from misplaced cutting, generation of foreign substances and damage to a semiconductor device region due to application of localized excessive pressure. This is accomplished by methods and systems, which, among other advantages, evenly apply an optimum dicing pressure to a wafer in a wafer dicing press. In other embodiments, a semiconductor wafer dicing system includes such a wafer dicing press.

According to an aspect of the inventive concept, there is provided a wafer dicing press including: a support unit supporting a first side of a wafer; and a pressurization device applying a pressure, by dispersing the pressure, to a second side of the wafer so that a laser-scribed layer of the wafer operates as a division starting point. That is, the laser-scribed layer includes regions weakened by laser-light and those weakened regions act to initiate cracking in a preferred area (that is, in the areas between semiconductor devices on the wafer) and in a preferred direction (that is, perpendicular to and between first and second wafer surfaces that include active devices on one hand and a substrate on another.

The support unit may include a support board; and an elastic layer which is formed on the support board and corresponds to, or, in operation, is on the side facing, the first side of the wafer.

The pressurization device may include a pressure generating device generating the pressure; and a pressure dispersing device evenly dispersing the pressure generated in the pressure generating device to the second side of the wafer.

The pressure generating device may include a frame in which an internal space is formed; a working fluid supplying device for supplying a working fluid; a fluid pressure line for connecting the frame to the working fluid supplying device to thereby form a passage, or conduit, for the working fluid; and a control unit for applying a control signal to the working fluid supplying device.

The control unit may apply a pressure control signal to the working fluid supplying device so that a pressure which is equal to or higher than a threshold dicing pressure is applied to the wafer.

The pressure dispersing device may include a diaphragm installed in one side of the frame in which an internal space is formed, and transmitting the pressure generated in the pressure generating device to the wafer.

The diaphragm may include a film having an elastic material, which deforms depending on a pressure of a working fluid.

According to another aspect of the inventive concept, there is provided a semiconductor wafer dicing system including: a laser device for radiating a laser beam so that a laser-scribed layer is formed in a wafer; a grinding device for grinding the wafer in which the laser-scribed layer is formed; and a wafer dicing press including a support unit for supporting a first side of the wafer, and a pressurization device for applying a pressure to a second side of the wafer so that the laser-scribed layer of the wafer operates as a division starting point, thereby cleaving the wafer along laser-scribed lines within the wafer.

The laser device may include an ultra-violet device radiating the laser beam so that the laser-scribed layer is formed within the wafer.

The grinding device may include a device for grinding a back side of the wafer.

The support unit of the wafer dicing press may include a support board; and an elastic layer formed on the support board and corresponds to, or, faces toward, the first side of the wafer.

The pressurization device of the wafer dicing press may include a pressure generating device for generating the pressure; and a pressure dispersing device for evenly dispersing the pressure generated in the pressure generating device to the second side of the wafer.

The pressure generating device may include a frame in which an internal space is formed; a working fluid supplying device for supplying a working fluid; a fluid pressure line connecting the frame to the working fluid supplying device to form a passage, or conduit, for supplying the working fluid; and a control unit for applying a control signal to the working fluid supplying device.

The pressure dispersing device may include a diaphragm installed in one side of a frame in which the internal space is formed, the diaphragm for transmitting a pressure of the working fluid to the wafer.

The semiconductor wafer dicing system may further include a tape attaching device for attaching a tape to an active side of the wafer.

A method in accordance with the principles of the inventive concept may include supporting a scribed semiconductor wafer from a first side and applying pressure to a second side of the semiconductor wafer The method may include scribing the wafer with a laser to form weakened regions within the wafer between semiconductor device regions formed in the wafer, taping the active side of the wafer, grinding the substrate side of the wafer, or applying a pressure at least equal to a threshold dicing pressure to the wafer, wherein pressure is applied to the inactive side of the wafer with an elastic diaphragm and the wafer is supported on its active side by an elastic layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

The present inventive concept will be described in detail hereinafter with reference to the accompanying drawings, in which exemplary embodiments of the inventive concept are shown. This inventive concept may, however, be embodied in different forms and should not be construed as limited to the exemplary embodiments set forth herein. Rather, these embodiments are provided so that this description will be thorough and complete, and will fully convey the scope of the inventive concept to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of a device in use or operation in addition to the orientation depicted in the figures. For example, if a device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar references in the context of describing the inventive concept (especially in the context of the claims) are to be construed to cover both the singular and the plural, unless otherwise indicated herein or clearly contradicted by context. The terms "comprising," "having," "including," and "containing" are to be construed as open-ended terms, i.e., meaning "including, but not limited to," unless otherwise noted. Various structural, logical, and electrical changes may be made without departing from the spirit or scope of the inventive concept. Flow charts may include steps that may be deleted or otherwise modified and the sequence set forth within a particular flow chart may be modified while keeping within the scope of the invention.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better describe the inventive concept and is not a limitation on the scope of the inventive concept unless otherwise specified.

The present inventive concept will be described with reference to perspective views, cross-sectional views, and/or plan views in the figures, in which exemplary embodiments of the inventive concept are shown. Thus, the profile of an exemplary view may be modified according to manufacturing techniques and/or allowances. That is, the exemplary embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Figure 1:
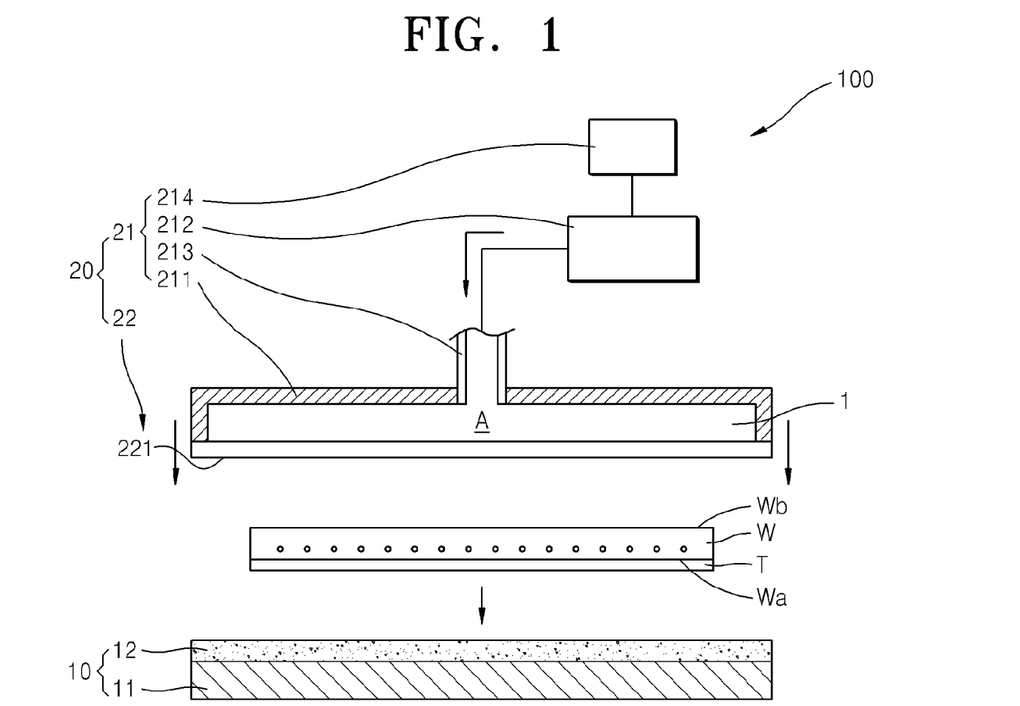
FIG. 1 is a conceptual diagram illustrating a pressure non-applying state of a wafer dicing press according to an exemplary embodiment of the inventive concept.
Figure 2:
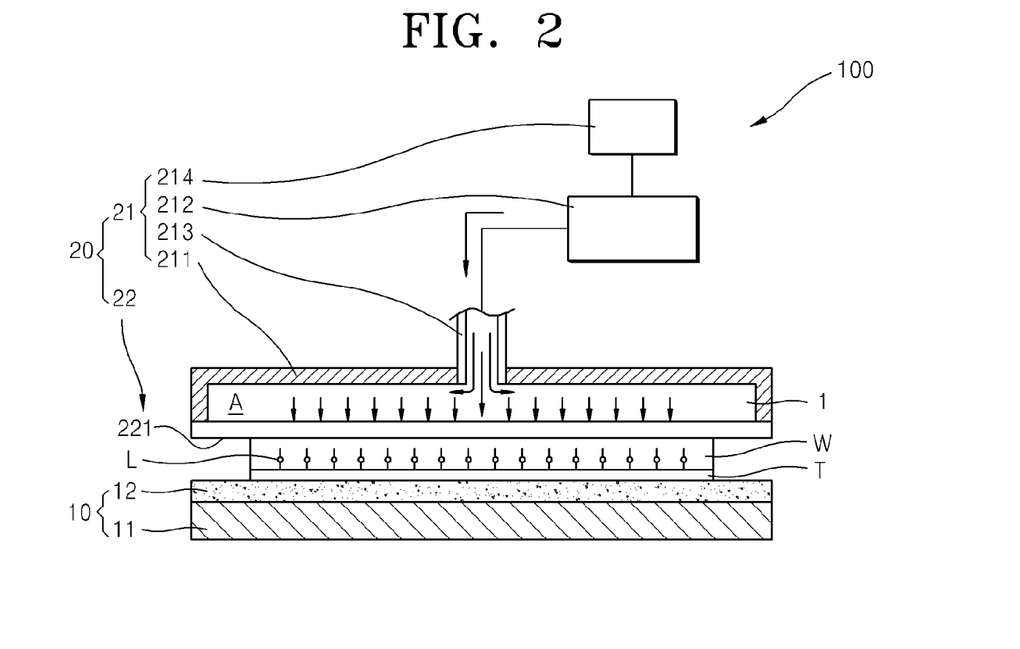
FIG. 2 is a conceptual diagram illustrating a pressure applying state of the wafer dicing press of FIG. 1.

In the conceptual diagram of FIG. 1 a wafer dicing press 100 according to an exemplary embodiment of the inventive concept is in a standby, non-pressurized, state, and in the conceptual diagram of FIG. 2 a wafer dicing press 100 according to an exemplary embodiment of the inventive concept is in an active, pressurized, state.

As illustrated in FIGS. 1 and 2, the wafer dicing press 100 may include a support unit 10 and a pressurization device 20.

In this exemplary embodiment, a wafer W in which a laser-scribed layer L is formed is mounted on the support unit 10. The laser-scribed layer L is formed, in an exemplary embodiment, by at least partially ablating, fracturing, or otherwise weakening, by laser radiation, scribe lanes within the wafer W to form frangible lines within the wafer W. Such frangible lines establish preferential regions and directions of cracking to facilitate separation of device regions of the wafer W. In an exemplary embodiment, the laser-scribed layer may be within, that is, on neither surface (Wa nor Wb) of, the wafer W. The support unit 10 supports a first side Wa, of the wafer W. A tape T is attached to the first side Wa of the wafer W. The support unit 10 may include a support board 11 of a size that is equal to or larger than that of the wafer W. The support unit 10 may also include an elastic layer 12 formed on a side of the support board 11 corresponding to, or, facing the first side Wa of the wafer W.

The elastic layer 12 may include one or more elastic materials, such as: rubber, silicon, or urethane, or a combination of such materials.

As indicated above, laser-ablating the wafer W to form laser-scribed layer L produces forms lines of weakness, or frangible lines, within the wafer W between devices and along which the wafer is more likely to break when pressure is applied. The tape T is attached to the first side Wa of the wafer W, which corresponds with an active side Wc of the wafer W, as described in greater detail in the discussion related to FIG. 7. With tape T applied to the active side Wc of the wafer W, the tape T may protect a semiconductor device region formed on the active side Wc from external foreign substances or impacts.

In the exemplary embodiment, the first side Wa of the wafer W and the active side Wc may coincide or may not coincide with each other.

In addition, the semiconductor device region may be protected from the external foreign substances, impacts, or a heavy pressure which may be applied from the pressurization device 20, by the elastic layer 12, which, in operation, faces the first side Wa of the wafer W. In operation, the elastic layer 12 acts to evenly distribute pressure across the entire wafer W, thereby ensuring substantially uniform separation of all devices within the wafer W and avoiding damage to the wafer that might result from excess and/or non-uniform application of pressure.

When activated, as illustrated in FIG. 2, the pressurization device 20 contacts and applies pressure to a second side Wb of the wafer W, forcing the wafer W against the elastic layer 12 and inducing the wafer to break along frangible lines formed in the laser-scribed layer L, thereby yielding individual devices from the wafer W. The pressurization device 20 may include a pressure generating device 21 that generates pressure in a working fluid and a pressure dispersing device 22 that evenly disperses the pressure generated in the pressure generating device 21 on the second side Wb of the wafer W.

Pressure generating device 21 may include a frame 211 in which an internal space A is formed, a working fluid supplying device 212 that supplies a working fluid 1 to the internal space A, a fluid pressure line 213 that connects the frame 211 to the working fluid supplying device 212, and a control unit 214 that applies a control signal to the working fluid supplying device 212 to regulate the pressure of the working fluid within the internal space A and, thereby, regulate the pressure applied to the wafer W.

In an exemplary embodiment, the working fluid 1 may be a readily available gas, such as air, for example. More particularly, the working fluid 1 may be, or may include, an inert gas, such as: nitrogen, helium, neon, argon, or the like.

Figure 5:
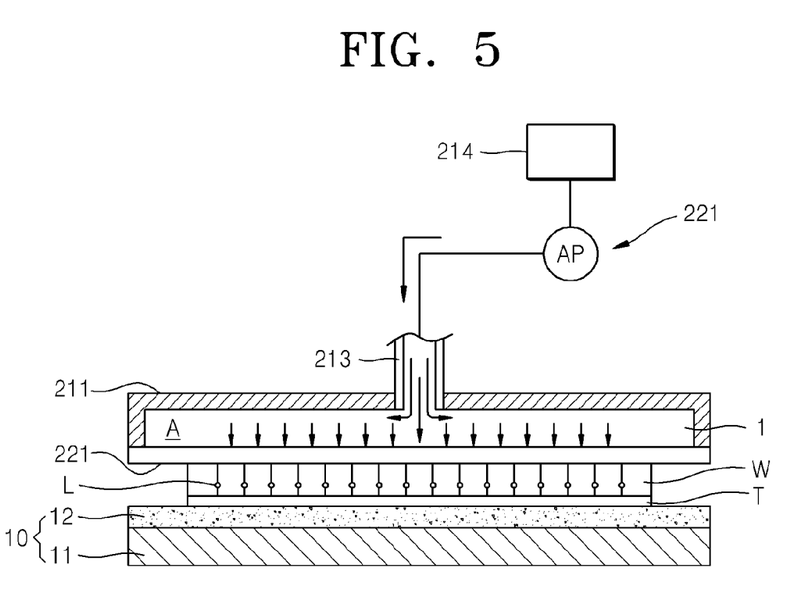
FIG. 5 is a conceptual diagram illustrating a pressure applying state of a wafer dicing press according to another exemplary embodiment of the inventive concept.

In the exemplary embodiment of FIG. 5 pressurization device 20 has been activated and is applying pressure to wafer W against elastic layer 12. In this exemplary embodiment, the working fluid supplying device 212 is an air pump AP. that pressurizes ambient air.

Figure 6:
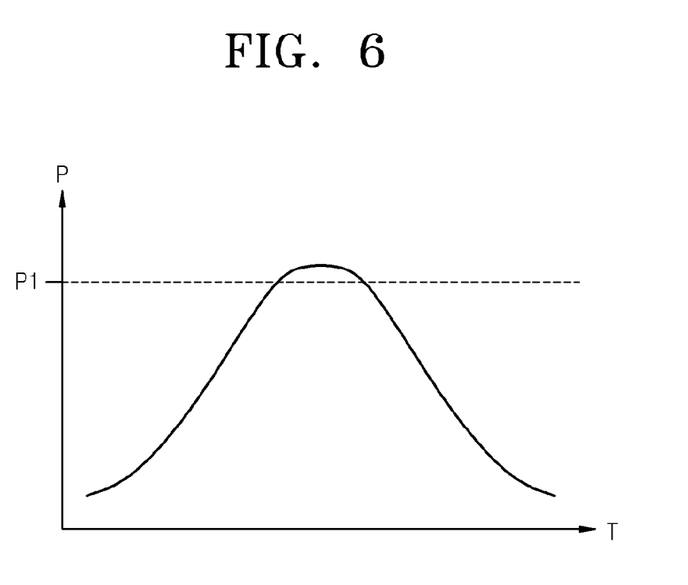
FIG. 6 is a graph illustrating a pressure operating on a wafer depending on time in a wafer dicing press according to another exemplary embodiment of the inventive concept.

A minimum, threshold, pressure must be applied to the wafer W in order to break the wafer into dice along frangible lines formed in the laser-scribed layer L. Too much pressure could damage the wafer W and/or constituent devices within the wafer W. In an exemplary embodiment pressure is applied in a manner reflected by the graph of pressure versus time in FIG. 6. According to an exemplary embodiment, the control unit 214 may apply a pressure control signal to the working fluid supplying device 212 so that a pressure P on the wafer W increases until it reaches a threshold dicing pressure P1, which is sufficient to separate the semiconductor devices within the wafer W. Pressure may be increased somewhat beyond the threshold dicing pressure P1 to allow for some marginal variation in processes. Because extra time and expense may be associated with applying pressure beyond the threshold dicing pressure P1 and because damage to the wafer W could result from excessive pressure, excursions beyond the threshold dicing pressure (to allow, for example, for process margins) are carefully controlled and applied for a minimal period of time. By carefully controlling the pressure and laser irradiation, the time required to irradiate and apply pressure to the wafer may be substantially reduced, thereby improving the efficiency of the dicing process without increasing the risk of damage to the semiconductor devices.

As illustrated in FIG. 2, the pressure dispersing device 22 may include a diaphragm 221 which is installed in one side of the frame 211 in which the internal space A is formed, and which transmits a pressure generated in the pressure generating device 21 to the wafer W.

In this exemplary embodiment, the diaphragm 221 may include elastic material that allows the diaphragm to deform in response to pressure from of the working fluid 1. The diaphragm 221 may include a cushioned surface that allows the diaphragm to conform to surface of the wafer W (surface Wb in this exemplary embodiment) and to efficiently disperse pressure along the surface of the wafer W. Elastic materials that may be employed for the diaphragm 221 may include one or more of: rubber, silicon, urethane, and a combination thereof.

Figure 3:
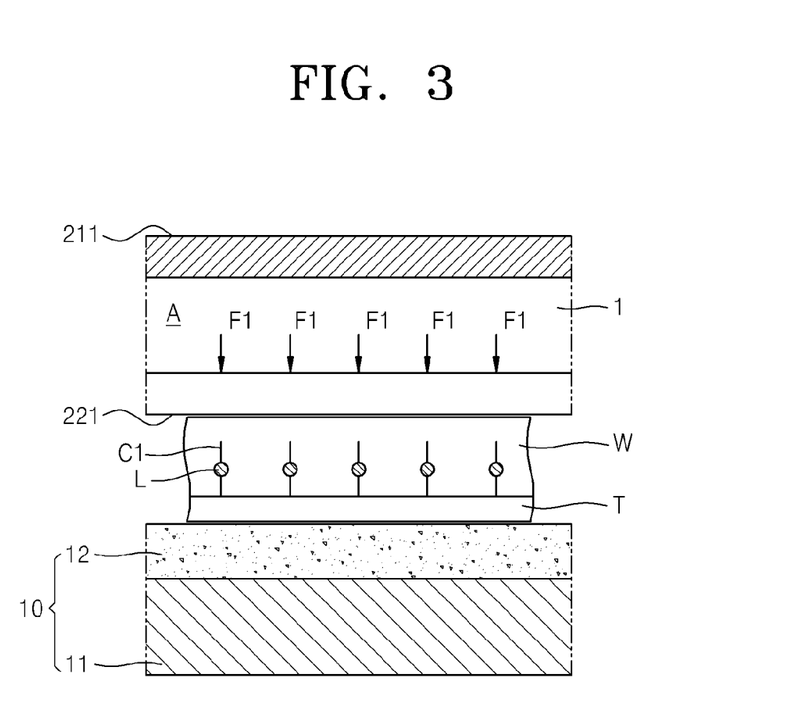
FIGS. 3 and 4 are conceptual diagrams each illustrating a crack progressing state of a wafer.
Figure 4:
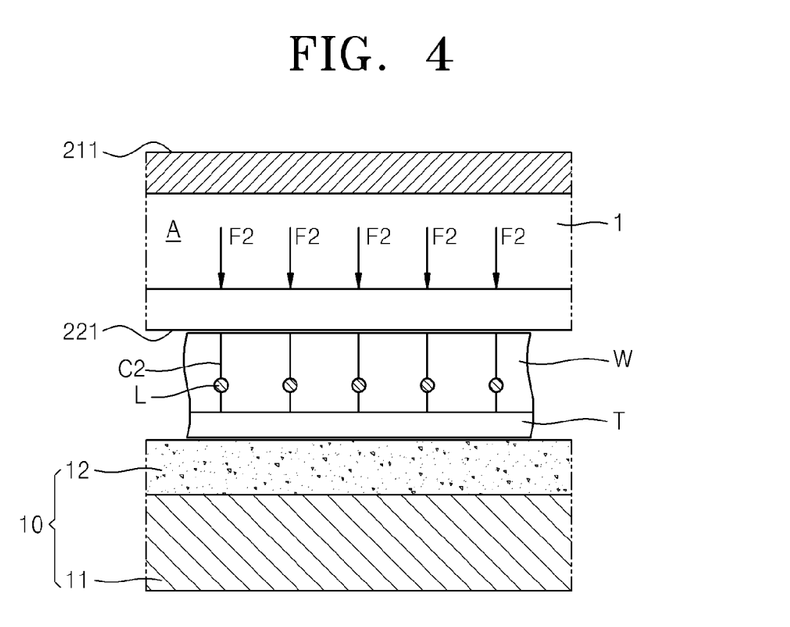

Just as FIGS. 1 and 2 illustrate the initial application of pressure to a wafer W, from the standby state of FIG. 1 to the application of pressure in FIG. 2, as steps of an exemplary wafer dicing process after the wafer W has been laser-scribed, the conceptual diagrams of FIGS. 3 and 4 illustrate the progress of wafer-cracking that takes place along the laser-scribed lines as a result of the application of pressure.

As illustrated in FIG. 3, if the working fluid 1 is supplied to the internal space A of the frame 211 and thus a relatively low pressure F1 is generated, the diaphragm 221 is deformed toward the wafer W by the pressure F1 of the working fluid 1, the diaphragm 221 makes contact with the wafer W, and thereby transmits pressure to the wafer W. Because, according to Boyle's law, the pressure and volume of a gas are inversely proportional to one another at a constant temperature, the pressure F1 of the working fluid 1 may evenly and uniformly operate on a surface of the diaphragm 221, and the diaphragm 221 may transmit this uniform pressure F1 to the surface Wb of the wafer W with which it comes in contact.

Accordingly, the uniform pressure F1 may be transmitted to laser-scribed layers L in the wafer W and the laser-scribed layers L may operate as division starting points, where cracking, such as C1, may be uniformly initiated in each of the laser-scribed layers L.

Even if the diaphragm 221 somehow inadvertently applies greater pressure to one area of the wafer W than another, the elastic layer 12 deforms and transmits excess pressure to portions of the wafer W at which pressures are lower, thereby averting the application of excess or non-uniform pressure to any region of the wafer W.

As illustrated in FIG. 4, if more working fluid 1 of this exemplary embodiment is continuously further supplied to the internal space A of the frame 211 and, as a result, a relatively high pressure F2 is generated within the space A, the diaphragm 221 is deformed further toward the wafer W by the pressure F2 of the working fluid 1 and pressed more firmly to the wafer W, thereby applying greater pressure to the wafer W.

In this manner, the pressure F2 of the working fluid 1 may evenly and uniformly operate on a surface of the diaphragm 221, and the diaphragm 221 may transmit this uniform higher pressure F2 to the whole surface of the wafer W.

Accordingly, the uniform higher pressure F2 may be transmitted to the laser-scribed layers L in the wafer W, and, with the higher pressure F2 applied, a complete crack C2 may be formed in each of the laser-scribed layers L. The wafer W then may be completely divided into parts, particularly into individual devices. In this exemplary embodiment, the crack C1, and, in its extended faun C2, is formed perpendicular to the planes of the top and bottom surfaces of the wafer W, in conformity with the crystalline structure of the wafer W. As a result, the crack C1, C2, formed in the scribe lanes between semiconductor device regions, may not intrude into the semiconductor device regions of the wafer W.

The elastic layer 12 acts to cushion the wafer W as pressure is applied and, therefore, may protect an active layer of the wafer W, even if pressure beyond the threshold pressure P1 is applied to the wafer W.

In this manner, it is possible to quickly and completely divide the wafer into parts by evenly applying a uniform pressure to the whole wafer by using the diaphragm 221. In addition, a minimum pressure which is equal to or higher than a threshold dicing pressure P1 may be precisely and uniformly applied to the wafer W, thereby avoiding damage to the wafer while ensuring that all devices within the wafer are separated from one another.

Figure 7:
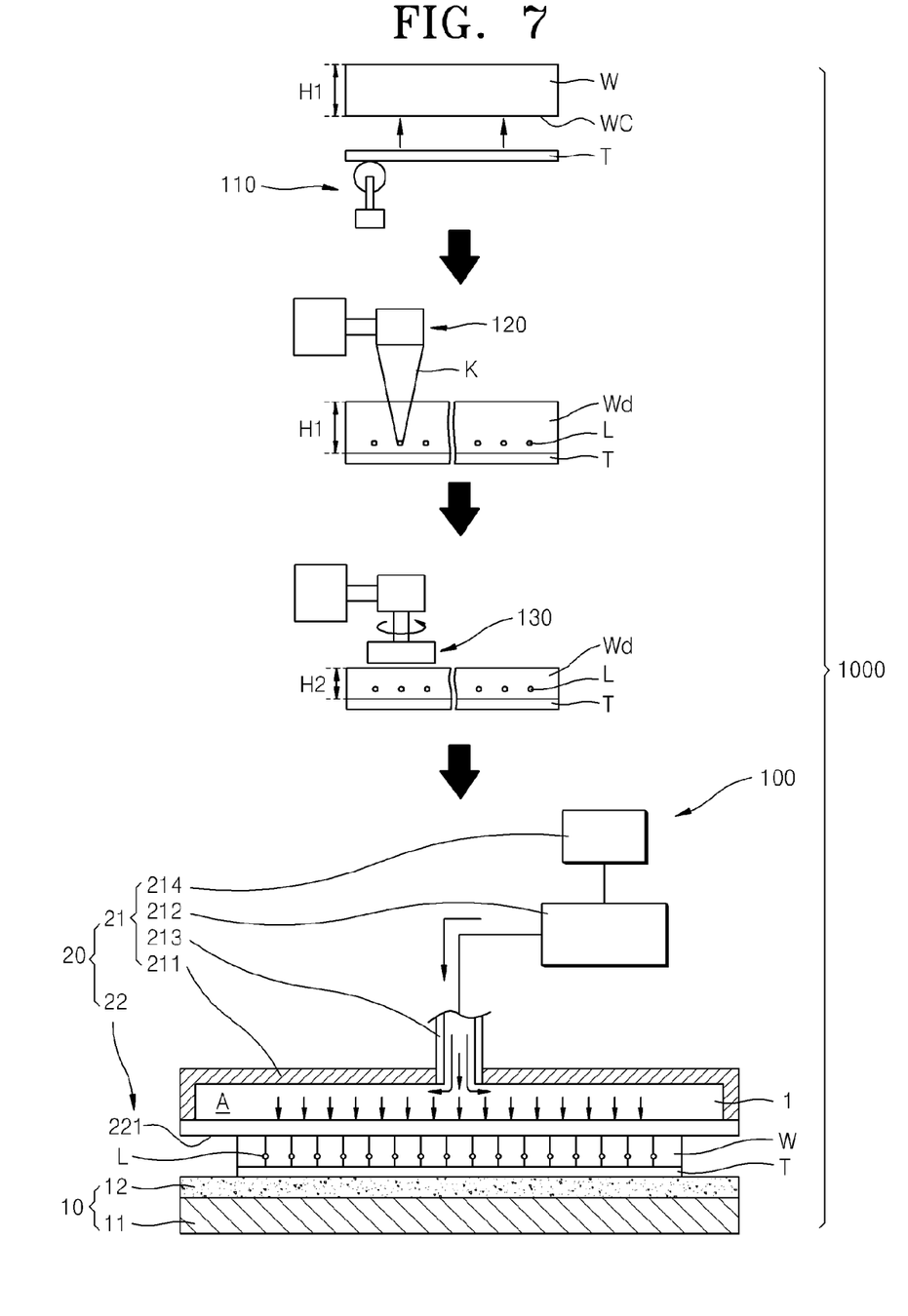
FIG. 7 is a conceptual diagram illustrating a semiconductor wafer dicing system according to an exemplary embodiment of the inventive concept.

FIG. 7 is a conceptual diagram illustrating a semiconductor wafer dicing system 1000 according to an exemplary embodiment of the inventive concept.

As illustrated in FIG. 7, the semiconductor wafer dicing system 1000 may include a tape attaching device 110, a laser device 120, a grinding device 130, and a wafer dicing press 100, as described in the discussion related to previous figures.

As illustrated in FIG. 7, the tape attaching device 110 is a device for attaching the tape T to an active side Wc of a wafer W. When applied, the tape T protects the active side Wc of the wafer W, at least in part, by preventing contaminants from intruding into a semiconductor device region and preventing the semiconductor device region being damaged by an external impact.

The laser device 120, which is a device for radiating a laser beam K so that a laser-scribed layer L is formed in the wafer W, may be an ultraviolet laser device, for example.

By focusing, and thereby concentrating, laser energy at the laser-scribed layer L, laser device 120 weakens the wafer W at the laser-scribed layer L, and thereby facilitates wafer-cleaving in preferred areas (that is, along scribe lanes) and preferred orientation (that is, perpendicular to and between wafer surfaces Wa and Wc).

For proper operation, a threshold-minimal amount of radiation must be delivered to the wafer W at the laser-scribed level L. In order to meet this threshold requirement, the laser device 120 focuses a prescribed level of radiation for a prescribed period of time at the laser-scribed layer 120, oriented along the scribe lanes that separate semiconductor devices within the wafer W from one another.

In an exemplary embodiment, the semiconductor wafer dicing system 1000 may divide the wafer W into semiconductor devices by scanning the wafer with the laser device once to form weakened regions at the laser-scribe layer L, then applying uniform pressure to the entire wafer using wafer-dicing press 106 to rapidly and precisely cleave the semiconductor devices from one another. The weakened regions at the laser-scribed layer L form "seed" regions from which cracks develop in preferred regions and orientations while pressure is applied uniformly across the wafer by the wafer-dicing press 100

The grinding device 130 may be used to grind a "back," or, inactive, side Wd of the wafer W in order to reduce the thickness of the wafer from a thickness H1 to a thickness H2. During the grinding process laser-weakened, or, laser-scribed, regions within the wafer may establish minute cracks, thereby initiating the cleaving of semiconductor devices from one another.

The wafer dicing press 100 of FIG. 7 according to the inventive concept, as stated above, may include a support unit 10 supporting a first side Wa of the wafer W and a pressurization device 20 applying a pressure to a second side Wb of the wafer W so that the laser-scribed layer L inside the wafer W operates as a division starting point.

Support unit 10 may include a support board 11 and an elastic layer 12 formed on the support board 11 and, in operation, facing the first side Wa of the wafer W. The pressurization device 20 may include a pressure generating device 21 that generates pressure in a working fluid and a pressure dispersing device 22 that evenly disperses the pressure generated in the pressure generating device 21 to the second side Wb of the wafer W.

The pressure generating device 21 may include a frame 211 in which an internal space A is formed, a working fluid supplying device 212 that supplies a working fluid 1 to the internal space A, a fluid pressure line 213 that connects the frame 211 to the working fluid supplying device 212, and a control unit 214 that applies a control signal to the working fluid supplying device 212 to regulate the pressure of the working fluid within the internal space A and, thereby, regulate the pressure applied to the wafer W.

The pressure dispersing device 22 may include a diaphragm 221 which is installed in one side of the frame 211 in which the internal space A is formed, and which transmits a pressure of the working fluid 1 to the wafer W. The diaphragm 221 may be a film, formed, at least in part, of an elastic material, which may deform to accommodate the pressure of the working fluid 1.

Figure 8:
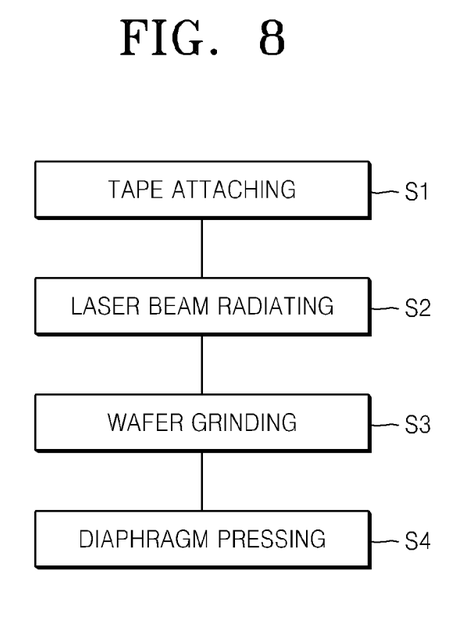
FIG. 8 is a flowchart illustrating a method of dicing a semiconductor wafer according to an exemplary embodiment of the inventive concept.

FIG. 8 is a flowchart illustrating a method of dicing a semiconductor wafer by using the semiconductor wafer dicing system 1000, according to an exemplary embodiment of the inventive concept.

A method of dicing a semiconductor wafer by using the semiconductor wafer dicing system 1000, as illustrated in FIG. 8, may include a tape attaching process S1 of attaching a tape T to an active side We of a wafer W by using the tape attaching device 110 of FIG. 7.

In process S2, a laser-scribed layer L may be formed in the wafer W using a focused laser beam supplying a prescribed power level for a prescribed period of time to induce weakening within the wafer in preferred regions and orientations and to thereby induce cleaving among semiconductor devices within the wafer W when pressure is applied to the wafer W.

In process S3 a wafer grinder 130 grinds the back, inactive, side Wb of the wafer W to thin and lighten the wafer W. As previously indicated, minute cracks may begin to emanate from the weakened areas of the laser-scribed layer L in response to grinding in this process.

In process S4 pressure is uniformly applied to the wafer W through operation of the dicing press 100. In particular, the application of pressure may be, most directly, through contact between the diaphragm 221 on the back, inactive, side Wb of the wafer W and elastic layer 12 on support board 11 on the taped active side Wa of the wafer W. Application of pressure in this manner promotes cracking, or, cleaving, between semiconductor devices on the wafer W.

In process S4, the control unit 214 may apply a pressure control signal to the working fluid supplying device 212 so that a pressure P on the wafer W increases until it reaches a threshold dicing pressure P1, which is sufficient to separate the semiconductor devices within the wafer W. Pressure may be increased somewhat beyond the threshold dicing pressure P1 to allow for some marginal variation in processes. Because extra time and expense may be associated with applying pressure beyond the threshold dicing pressure P1 and because damage to the wafer W could result from excessive pressure, excursions beyond the threshold dicing pressure (to allow, for example, for process margins) are carefully controlled and applied for a minimal period of time.

In exemplary embodiments, pressure may be applied, under control of control unit 214 in various schemes that include different rates of increasing and decreasing pressure, different periods of time at which pressure is maintained at a given level and repeated cycles of increasing and decreasing pressure, for example. Pressure on the wafer W may, for example, be gradually increased until the threshold dicing pressure P1 is reached, then held at that pressure, then somewhat more rapidly decreased to, for example, ambient pressure. Pressure may be increased to the threshold dicing pressure P1, held, decreased, then returned to the threshold dicing pressure P1, before being released to ambient pressure, for example. Such cycles of increasing and decreasing pressure may be repeated. Pressure transitions may be regulated to avoid damaging the wafer W or devices located therein and such regulation may take into account wafer parameters, such as wafer thickness, and characteristics of the laser-scribed layer L, for example.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A wafer dicing press comprising:
   a support unit supporting a first side of a wafer; and
   a pressurization device applying a uniform pressure across the wafer, by dispersing the pressure, to a second side of the wafer so that a laser-scribed layer of the wafer operates as a division starting point.

2. The wafer dicing press of claim 1, wherein the support unit comprises:
   a support board; and
   an elastic layer which is formed on the support board and corresponds to the first side of the wafer.

3. The wafer dicing press of claim 1, wherein the pressurization device comprises:
   a pressure generating device generating the pressure; and
   a pressure dispersing device evenly dispersing the pressure generated in the pressure generating device to the second side of the wafer.

4. The wafer dicing press of claim 3, wherein the pressure generating device comprises:
   a frame in which an internal space is formed;
   a working fluid supplying device supplying a working fluid;
   a fluid pressure line connecting the frame to the working fluid supplying device to form a passage of the working fluid; and
   a control unit applying a control signal to the working fluid supplying device.

5. The wafer dicing press of claim 4, wherein the control unit applies a pressure control signal to the working fluid supplying device so that a pressure which is equal to or higher than a threshold dicing pressure is applied to the wafer.

6. The wafer dicing press of claim 3, wherein the pressure dispersing device comprises a diaphragm installed in one side of the frame in which an internal space is formed, and transmitting the pressure generated in the pressure generating device to the wafer.

7. The wafer dicing press of claim 6, wherein the diaphragm comprises a film having an elastic material, which deforms depending on a pressure of a working fluid.

8. A semiconductor wafer dicing system comprising:
   a laser device radiating a laser beam so that a laser-scribed layer is formed in a wafer;
   a grinding device grinding the wafer in which the laser-scribed layer is formed; and
   a wafer dicing press comprising a support unit supporting a first side of the wafer, and a pressurization device applying a uniform pressure across to a second side of the wafer so that the laser-scribed layer of the wafer operates as a division starting point.

9. The semiconductor wafer dicing system of claim 8, wherein the laser device comprises a ultra-violet laser device radiating the laser beam so that the laser-scribed layer is formed in the wafer.

10. The semiconductor wafer dicing system of claim 8, wherein the grinding device comprises a device grinding a back side of the wafer.

11. The semiconductor wafer dicing system of claim 8, wherein the support unit of the wafer dicing press comprises:
    a support board; and
    an elastic layer which is formed on the support board and corresponds to the first side of the wafer.

12. The semiconductor wafer dicing system of claim 8, wherein the pressurization device of the wafer dicing press comprises:
    a pressure generating device generating the pressure; and
    a pressure dispersing device evenly dispersing the pressure generated in the pressure generating device to the second side of the wafer.

13. The semiconductor wafer dicing system of claim 12, wherein the pressure generating device comprises:
    a frame in which an internal space is formed;
    a working fluid supplying device supplying a working fluid;
    a fluid pressure line connecting the frame to the working fluid supplying device to form a passage of the working fluid; and
    a control unit applying a control signal to the working fluid supplying device.

14. The semiconductor wafer dicing system of claim 12, wherein the pressure dispersing device comprises a diaphragm installed in one side of a frame in which the internal space is formed, and transmitting a pressure of the working fluid to the wafer.

15. The semiconductor wafer dicing system of claim 8, further comprising a tape attaching device attaching a tape to an active side of the wafer.

* * * * *